United States Patent [19]

Shirota

[11] 4,387,364

[45] Jun. 7, 1983

[54] METHOD AND APPARATUS FOR REDUCING DC COMPONENTS IN A DIGITAL INFORMATION SIGNAL

[75] Inventor: Norihisa Shirota, Atsugi, Japan

[73] Assignee: Sony Corporation, Tokyo, Japan

[21] Appl. No.: 171,481

[22] Filed: Jul. 23, 1980

[30] Foreign Application Priority Data

Jul. 23, 1979 [JP] Japan ................................. 54-93504

[51] Int. Cl.³ ............................................. H04L 3/00
[52] U.S. Cl. ............................... 340/347 DD; 375/19;
358/261; 360/39; 360/40
[58] Field of Search ................ 340/347 DD; 358/261;
375/19; 371/55, 56; 360/39, 40; 235/310, 311

[56] References Cited

U.S. PATENT DOCUMENTS

| | | | |
|---|---|---|---|
| 3,631,471 | 12/1971 | Griffiths | 340/347 DD |
| 4,020,282 | 4/1977 | Halpern | 360/40 X |
| 4,161,757 | 6/1977 | Spencer et al. | 358/261 |
| 4,168,513 | 9/1979 | Hains et al. | 358/261 |

OTHER PUBLICATIONS

Baldwin, Digital Television Recording With Low Tape Consumption, International Broadcasting Convention 1978, IEE Conference Publication No. 166, pp. 133–136.

Primary Examiner—T. J. Sloyan
Attorney, Agent, or Firm—Lewis H. Eslinger; Alvin Sinderbrand

[57] ABSTRACT

A method of reducing DC components in a digital information signal comprised of a plurality of 8-bit data words by converting each of the 8-bit data words to a 10-bit data word, comprises the steps of grouping the 10-bit data words by weight in accordance with the run length of data of each of the 10-bit data words, with the 10-bit data words only including five or six logic level "1" bits; assigning each of the 8-bit data words to one of the 10-bit data words in accordance with the frequency of occurrence of the 8-bit data words so that 8-bit data words having a high frequency of occurrence are assigned to 10-bit data words having a short run length; classifying the grouped 10-bit data words into a first group consisting of 10-bit data words having five logic level "1" bits, a second group consisting of 10-bit data words having six logic level "1" bits, and a third group consisting of 10-bit data words having four logic level "1" bits, with the third group being formed by inverting the 10-bit words in the second group; and further assigning the 8-bit words alternately to the 10-bit words in the second and third groups when such 8-bit words correspond to previously assigned 10-bit words having six logic level "1" bits and assigning the remaining 8-bit words to the 10-bit words in the first group.

22 Claims, 13 Drawing Figures

FIG. 4

| STEP | MAP 1 | | | | MAP 2 | | | | STEP | MAP 1 | | | | MAP 2 | | | |
|---|---|---|---|---|---|---|---|---|---|---|---|---|---|---|---|---|---|
| | DECIMAL | CODE | ISUM | IDV | IW | DECIMAL | CODE | ISUM | IDV | IW | | DECIMAL | CODE | ISUM | IDV | IW | DECIMAL | CODE | ISUM | IDV | IW |
| 0 | 460 | 0111001100 | 5 | 4 | 7 | 460 | 0111001100 | 5 | 4 | 7 | 34 | 283 | 0100011011 | 5 | 5 | 7 | 283 | 0100011011 | 5 | 5 | 7 |
| 1 | 236 | 0011101100 | 5 | 4 | 7 | 236 | 0011101100 | 5 | 4 | 7 | 35 | 229 | 0011100101 | 5 | 5 | 7 | 229 | 0011100101 | 5 | 5 | 7 |
| 2 | 220 | 0011011100 | 5 | 4 | 7 | 220 | 0011011100 | 5 | 4 | 7 | 36 | 167 | 0010100111 | 5 | 5 | 7 | 167 | 0010100111 | 5 | 5 | 7 |
| 3 | 948 | 1110110100 | 6 | 5 | 7 | 75 | 0001001011 | 4 | 5 | 7 | 37 | 151 | 0010010111 | 5 | 5 | 7 | 151 | 0010010111 | 5 | 5 | 7 |
| 4 | 940 | 1110101100 | 6 | 5 | 7 | 83 | 0001010011 | 4 | 5 | 7 | 38 | 107 | 0001101011 | 5 | 5 | 7 | 107 | 0001101011 | 5 | 5 | 7 |
| 5 | 922 | 1110011010 | 6 | 5 | 7 | 101 | 0001100101 | 4 | 5 | 7 | 39 | 937 | 1110101001 | 6 | 6 | 7 | 86 | 0001010110 | 4 | 6 | 7 |
| 6 | 884 | 1101110100 | 6 | 5 | 7 | 139 | 0010001011 | 4 | 5 | 7 | 40 | 917 | 1110010101 | 6 | 6 | 7 | 106 | 0001101010 | 4 | 6 | 7 |
| 7 | 860 | 1101011100 | 6 | 5 | 7 | 163 | 0010100011 | 4 | 5 | 7 | 41 | 741 | 1011100101 | 6 | 6 | 7 | 282 | 0100011010 | 4 | 6 | 7 |
| 8 | 826 | 1100111010 | 6 | 5 | 7 | 197 | 0011000101 | 4 | 5 | 7 | 42 | 679 | 1010100111 | 6 | 6 | 7 | 344 | 0101011000 | 4 | 6 | 7 |
| 9 | 748 | 1011101100 | 6 | 5 | 7 | 275 | 0100010011 | 4 | 5 | 7 | 43 | 663 | 1010010111 | 6 | 6 | 7 | 360 | 0101101000 | 4 | 6 | 7 |
| 10 | 732 | 1011011100 | 6 | 5 | 7 | 291 | 0100100011 | 4 | 5 | 7 | 44 | 605 | 1001011101 | 6 | 6 | 7 | 418 | 0110100010 | 4 | 6 | 7 |
| 11 | 630 | 1001110110 | 6 | 5 | 7 | 393 | 0110001001 | 4 | 5 | 7 | 45 | 474 | 0111011010 | 5 | 6 | 7 | 549 | 1000100101 | 4 | 6 | 7 |
| 12 | 473 | 0111011001 | 6 | 5 | 7 | 550 | 1000100110 | 4 | 5 | 7 | 46 | 442 | 0110111010 | 5 | 6 | 7 | 581 | 1001000101 | 4 | 6 | 7 |
| 13 | 461 | 0111001101 | 6 | 5 | 7 | 562 | 1000110010 | 4 | 5 | 7 | 47 | 374 | 0101110110 | 5 | 6 | 7 | 649 | 1010001001 | 4 | 6 | 7 |
| 14 | 441 | 0110111001 | 6 | 5 | 7 | 582 | 1001000110 | 4 | 5 | 7 | 48 | 849 | 1101010001 | 5 | 6 | 7 | 849 | 1101010001 | 5 | 6 | 7 |
| 15 | 413 | 0110011101 | 6 | 5 | 7 | 610 | 1001100010 | 4 | 5 | 7 | 49 | 789 | 1100010101 | 5 | 6 | 7 | 789 | 1100010101 | 5 | 6 | 7 |
| 16 | 371 | 0101110011 | 6 | 5 | 7 | 652 | 1010001100 | 4 | 5 | 7 | 50 | 709 | 1011000101 | 5 | 6 | 7 | 709 | 1011000101 | 5 | 6 | 7 |
| 17 | 315 | 0100111011 | 6 | 5 | 7 | 708 | 1011000100 | 4 | 5 | 7 | 51 | 675 | 1010100011 | 5 | 6 | 7 | 675 | 1010100011 | 5 | 6 | 7 |
| 18 | 237 | 0011101101 | 6 | 5 | 7 | 786 | 1100010010 | 4 | 5 | 7 | 52 | 651 | 1010001011 | 5 | 6 | 7 | 651 | 1010001011 | 5 | 6 | 7 |
| 19 | 221 | 0011011101 | 6 | 5 | 7 | 802 | 1100100010 | 4 | 5 | 7 | 53 | 557 | 1000101101 | 5 | 6 | 7 | 557 | 1000101101 | 5 | 6 | 7 |
| 20 | 187 | 0010111011 | 6 | 5 | 7 | 836 | 1101000100 | 4 | 5 | 7 | 54 | 468 | 0111010100 | 5 | 6 | 7 | 468 | 0111010100 | 5 | 6 | 7 |
| 21 | 932 | 1110100100 | 5 | 5 | 7 | 932 | 1110100100 | 5 | 5 | 7 | 55 | 458 | 0111001010 | 5 | 6 | 7 | 458 | 0111001010 | 5 | 6 | 7 |
| 22 | 914 | 1110010010 | 5 | 5 | 7 | 914 | 1110010010 | 5 | 5 | 7 | 56 | 370 | 0101110010 | 5 | 6 | 7 | 370 | 0101110010 | 5 | 6 | 7 |
| 23 | 866 | 1101100010 | 5 | 5 | 7 | 866 | 1101100010 | 5 | 5 | 7 | 57 | 334 | 0101001110 | 5 | 6 | 7 | 334 | 0101001110 | 5 | 6 | 7 |
| 24 | 838 | 1101000110 | 5 | 5 | 7 | 838 | 1101000110 | 5 | 5 | 7 | 58 | 302 | 0100101110 | 5 | 6 | 7 | 302 | 0100101110 | 5 | 6 | 7 |
| 25 | 790 | 1100010110 | 5 | 5 | 7 | 790 | 1100010110 | 5 | 5 | 7 | 59 | 186 | 0010111010 | 5 | 6 | 7 | 186 | 0010111010 | 5 | 6 | 7 |
| 26 | 728 | 1011011000 | 5 | 5 | 7 | 728 | 1011011000 | 5 | 5 | 7 | 60 | 938 | 1110101010 | 6 | 7 | 7 | 85 | 0001010101 | 4 | 7 | 7 |
| 27 | 668 | 1010011100 | 5 | 5 | 7 | 668 | 1010011100 | 5 | 5 | 7 | 61 | 698 | 1010111010 | 6 | 7 | 7 | 325 | 0101000101 | 4 | 7 | 7 |
| 28 | 626 | 1001110010 | 5 | 5 | 7 | 626 | 1001110010 | 5 | 5 | 7 | 62 | 469 | 0111010101 | 6 | 7 | 7 | 554 | 1000101010 | 4 | 7 | 7 |
| 29 | 590 | 1001001110 | 5 | 5 | 7 | 590 | 1001001110 | 5 | 5 | 7 | 63 | 349 | 0101011101 | 6 | 7 | 7 | 674 | 1010100010 | 4 | 7 | 7 |
| 30 | 457 | 0111001001 | 5 | 5 | 7 | 457 | 0111001001 | 5 | 5 | 7 | 64 | 819 | 1100110011 | 6 | 4 | 10 | 204 | 0011001100 | 4 | 10 | 10 |
| 31 | 419 | 0110100011 | 5 | 5 | 7 | 419 | 0110100011 | 5 | 5 | 7 | 65 | 870 | 1101100110 | 6 | 5 | 10 | 153 | 0010011001 | 4 | 5 | 10 |
| 32 | 395 | 0110001011 | 5 | 5 | 7 | 395 | 0110001011 | 5 | 5 | 7 | 66 | 435 | 0110110011 | 6 | 5 | 10 | 588 | 1001001100 | 4 | 5 | 10 |
| 33 | 313 | 0100111001 | 5 | 5 | 7 | 313 | 0100111001 | 5 | 5 | 7 | 67 | 219 | 0011011011 | 6 | 5 | 10 | 804 | 1100100100 | 4 | 5 | 10 |

FIG. 5

| STEP | MAP 1 | | | | MAP 2 | | | | STEP | MAP 1 | | | | MAP 2 | | | |
|---|---|---|---|---|---|---|---|---|---|---|---|---|---|---|---|---|---|
| | DECIMAL | CODE | ISUM | IDV | IW | DECIMAL | CODE | ISUM | IDV | IW | | DECIMAL | CODE | ISUM | IDV | IW | DECIMAL | CODE | ISUM | IDV | IW |
| 68 | 844 | 1101001100 | 5 | 5 | 10 | 844 | 1101001100 | 5 | 5 | 10 | 102 | 427 | 0110101011 | 6 | 7 | 10 | 596 | 1001010100 | 4 | 7 | 10 |
| 69 | 818 | 1100110010 | 5 | 5 | 10 | 818 | 1100110010 | 5 | 5 | 10 | 103 | 363 | 0101101011 | 6 | 7 | 10 | 660 | 1010010100 | 4 | 7 | 10 |
| 70 | 806 | 1100100110 | 5 | 5 | 10 | 806 | 1100100110 | 5 | 5 | 10 | 104 | 852 | 1101010100 | 5 | 7 | 10 | 852 | 1101010100 | 5 | 7 | 10 |
| 71 | 620 | 1001101100 | 5 | 5 | 10 | 620 | 1001101100 | 5 | 5 | 10 | 105 | 842 | 1101001010 | 5 | 7 | 10 | 842 | 1101001010 | 5 | 7 | 10 |
| 72 | 409 | 0110011001 | 5 | 5 | 10 | 409 | 0110011001 | 5 | 5 | 10 | 106 | 724 | 1011010100 | 5 | 7 | 10 | 724 | 1011010100 | 5 | 7 | 10 |
| 73 | 307 | 0100110011 | 5 | 5 | 10 | 307 | 0100110011 | 5 | 5 | 10 | 107 | 714 | 1011001010 | 5 | 7 | 10 | 714 | 1011001010 | 5 | 7 | 10 |
| 74 | 211 | 0011010011 | 5 | 5 | 10 | 211 | 0011010011 | 5 | 5 | 10 | 108 | 690 | 1010110010 | 5 | 7 | 10 | 690 | 1010110010 | 5 | 7 | 10 |
| 75 | 203 | 0011001011 | 5 | 5 | 10 | 203 | 0011001011 | 5 | 5 | 10 | 109 | 678 | 1010100110 | 5 | 7 | 10 | 678 | 1010100110 | 5 | 7 | 10 |
| 76 | 155 | 0010011011 | 5 | 5 | 10 | 155 | 0010011011 | 5 | 5 | 10 | 110 | 662 | 1010010110 | 5 | 7 | 10 | 662 | 1010010110 | 5 | 7 | 10 |
| 77 | 869 | 1101100101 | 5 | 6 | 10 | 172 | 0010101100 | 4 | 6 | 10 | 111 | 602 | 1001011010 | 5 | 7 | 10 | 602 | 1001011010 | 5 | 7 | 10 |
| 78 | 851 | 1101010011 | 5 | 6 | 10 | 180 | 0010110100 | 4 | 6 | 10 | 112 | 425 | 0110101001 | 5 | 7 | 10 | 425 | 0110101001 | 5 | 7 | 10 |
| 79 | 843 | 1101001011 | 5 | 6 | 10 | 180 | 0010110100 | 4 | 6 | 10 | 113 | 405 | 0110010101 | 5 | 7 | 10 | 405 | 0110010101 | 5 | 7 | 10 |
| 80 | 813 | 1100101101 | 5 | 6 | 10 | 210 | 0011010010 | 4 | 6 | 10 | 114 | 357 | 0101100101 | 5 | 7 | 10 | 357 | 0101100101 | 5 | 7 | 10 |
| 81 | 729 | 1011011001 | 5 | 6 | 10 | 294 | 0100100110 | 4 | 6 | 10 | 115 | 339 | 0101010011 | 5 | 7 | 10 | 339 | 0101010011 | 5 | 7 | 10 |
| 82 | 717 | 1011001101 | 5 | 6 | 10 | 306 | 0100110010 | 4 | 6 | 10 | 116 | 331 | 0101001011 | 5 | 7 | 10 | 331 | 0101001011 | 5 | 7 | 10 |
| 83 | 691 | 1010110011 | 5 | 6 | 10 | 332 | 0101001100 | 4 | 6 | 10 | 117 | 301 | 0100101101 | 5 | 7 | 10 | 301 | 0100101101 | 5 | 7 | 10 |
| 84 | 621 | 1001101101 | 5 | 6 | 10 | 402 | 0110010010 | 4 | 6 | 10 | 118 | 213 | 0011010101 | 5 | 7 | 10 | 213 | 0011010101 | 5 | 7 | 10 |
| 85 | 603 | 1001011011 | 5 | 6 | 10 | 420 | 0110100100 | 4 | 6 | 10 | 119 | 173 | 0010101101 | 5 | 7 | 10 | 173 | 0010101101 | 5 | 7 | 10 |
| 86 | 841 | 1101001001 | 5 | 5 | 10 | 841 | 1101001001 | 5 | 5 | 10 | 120 | 853 | 1101010101 | 6 | 8 | 10 | 170 | 0010101010 | 4 | 8 | 10 |
| 87 | 805 | 1100100101 | 5 | 5 | 10 | 805 | 1100100101 | 5 | 5 | 10 | 121 | 693 | 1010110101 | 6 | 8 | 10 | 330 | 0101001010 | 4 | 8 | 10 |
| 88 | 665 | 1010011001 | 5 | 5 | 10 | 665 | 1010011001 | 5 | 5 | 10 | 122 | 683 | 1010101011 | 6 | 8 | 10 | 340 | 0101010100 | 4 | 8 | 10 |
| 89 | 617 | 1001101001 | 5 | 5 | 10 | 617 | 1001101001 | 5 | 5 | 10 | 123 | 677 | 1010100101 | 5 | 8 | 10 | 677 | 1010100101 | 5 | 8 | 10 |
| 90 | 601 | 1001011001 | 5 | 5 | 10 | 601 | 1001011001 | 5 | 5 | 10 | 124 | 597 | 1001010101 | 5 | 8 | 10 | 597 | 1001010101 | 5 | 8 | 10 |
| 91 | 589 | 1001001101 | 5 | 5 | 10 | 589 | 1001001101 | 5 | 5 | 10 | 125 | 362 | 0101101010 | 5 | 8 | 10 | 362 | 0101101010 | 5 | 8 | 10 |
| 92 | 436 | 0110110100 | 5 | 5 | 10 | 436 | 0110110100 | 5 | 5 | 10 | 126 | 342 | 0101010110 | 5 | 8 | 10 | 342 | 0101010110 | 5 | 8 | 10 |
| 93 | 428 | 0110101100 | 5 | 5 | 10 | 428 | 0110101100 | 5 | 5 | 10 | 127 | 341 | 0101010101 | 5 | 9 | 10 | 341 | 0101010101 | 5 | 9 | 10 |
| 94 | 410 | 0110011010 | 5 | 5 | 10 | 410 | 0110011010 | 5 | 5 | 10 | 128 | 682 | 1010101010 | 5 | 9 | 10 | 682 | 1010101010 | 5 | 9 | 10 |
| 95 | 364 | 0101101100 | 5 | 5 | 10 | 364 | 0101101100 | 5 | 5 | 10 | 129 | 346 | 0101011010 | 5 | 8 | 10 | 346 | 0101011010 | 5 | 8 | 10 |
| 96 | 310 | 0100110110 | 5 | 5 | 10 | 310 | 0100110110 | 5 | 5 | 10 | 130 | 426 | 0110101010 | 5 | 8 | 10 | 426 | 0110101010 | 5 | 8 | 10 |
| 97 | 214 | 0011010110 | 5 | 5 | 10 | 214 | 0011010110 | 5 | 5 | 10 | 131 | 661 | 1010010101 | 5 | 8 | 10 | 661 | 1010010101 | 5 | 8 | 10 |
| 98 | 874 | 1101101010 | 5 | 6 | 10 | 149 | 0010010101 | 4 | 6 | 10 | 132 | 681 | 1010101001 | 5 | 8 | 10 | 681 | 1010101001 | 5 | 8 | 10 |
| 99 | 854 | 1101010110 | 5 | 6 | 10 | 169 | 0010101001 | 4 | 6 | 10 | 133 | 685 | 1010101101 | 6 | 8 | 10 | 338 | 0101010010 | 4 | 8 | 10 |
| 100 | 726 | 1011010110 | 5 | 6 | 10 | 297 | 0100101001 | 4 | 6 | 10 | 134 | 725 | 1011010101 | 6 | 8 | 10 | 298 | 0100101010 | 4 | 8 | 10 |
| 101 | 437 | 0110110101 | 6 | 6 | 10 | 586 | 1001001010 | 4 | 6 | 10 | 135 | 171 | 0010101011 | 5 | 7 | 10 | 171 | 0010101011 | 5 | 7 | 10 |

FIG. 6

| STEP | MAP 1 DECIMAL | MAP 1 CODE | MAP 1 ISUM | MAP 1 IDV | MAP 1 IW | MAP 2 DECIMAL | MAP 2 CODE | MAP 2 ISUM | MAP 2 IDV | MAP 2 IW | STEP | MAP 1 DECIMAL | MAP 1 CODE | MAP 1 ISUM | MAP 1 IDV | MAP 1 IW | MAP 2 DECIMAL | MAP 2 CODE | MAP 2 ISUM | MAP 2 IDV | MAP 2 IW |
|---|---|---|---|---|---|---|---|---|---|---|---|---|---|---|---|---|---|---|---|---|---|
| 136 | 181 | 0010110101 | 5 | 7 | 10 | 181 | 0010110101 | 5 | 7 | 10 | 170 | 619 | 1001101011 | 6 | 6 | 10 | 404 | 0110010100 | 4 | 6 | 10 |
| 137 | 299 | 0100101011 | 5 | 7 | 10 | 299 | 0100101011 | 5 | 7 | 10 | 171 | 667 | 1010011011 | 6 | 6 | 10 | 356 | 0101100100 | 4 | 6 | 10 |
| 138 | 309 | 0100110101 | 5 | 7 | 10 | 309 | 0100110101 | 5 | 7 | 10 | 172 | 715 | 1011001011 | 6 | 6 | 10 | 308 | 0100110100 | 4 | 6 | 10 |
| 139 | 333 | 0101001101 | 5 | 7 | 10 | 333 | 0101001101 | 5 | 7 | 10 | 173 | 723 | 1011010011 | 6 | 6 | 10 | 300 | 0100101100 | 4 | 6 | 10 |
| 140 | 345 | 0101011001 | 5 | 7 | 10 | 345 | 0101011001 | 5 | 7 | 10 | 174 | 811 | 1100101011 | 6 | 6 | 10 | 212 | 0011010100 | 4 | 6 | 10 |
| 141 | 361 | 0101101001 | 5 | 7 | 10 | 361 | 0101101001 | 5 | 7 | 10 | 175 | 821 | 1100110101 | 6 | 6 | 10 | 202 | 0011001010 | 4 | 6 | 10 |
| 142 | 421 | 0110100101 | 5 | 7 | 10 | 421 | 0110100101 | 5 | 7 | 10 | 176 | 845 | 1101001101 | 6 | 6 | 10 | 178 | 0010110010 | 4 | 6 | 10 |
| 143 | 598 | 1001010110 | 5 | 7 | 10 | 598 | 1001010110 | 5 | 7 | 10 | 177 | 857 | 1101011001 | 6 | 6 | 10 | 166 | 0010100110 | 4 | 6 | 10 |
| 144 | 618 | 1001101010 | 5 | 7 | 10 | 618 | 1001101010 | 5 | 7 | 10 | 178 | 873 | 1101101001 | 6 | 6 | 10 | 150 | 0010010110 | 4 | 6 | 10 |
| 145 | 666 | 1010011010 | 5 | 7 | 10 | 666 | 1010011010 | 5 | 7 | 10 | 179 | 179 | 0010110011 | 5 | 5 | 10 | 179 | 0010110011 | 5 | 5 | 10 |
| 146 | 684 | 1010101100 | 5 | 7 | 10 | 684 | 1010101100 | 5 | 7 | 10 | 180 | 205 | 0011001101 | 5 | 5 | 10 | 205 | 0011001101 | 5 | 5 | 10 |
| 147 | 692 | 1010110100 | 5 | 7 | 10 | 692 | 1010110100 | 5 | 7 | 10 | 181 | 217 | 0011011001 | 5 | 5 | 10 | 217 | 0011011001 | 5 | 5 | 10 |
| 148 | 722 | 1011010010 | 5 | 7 | 10 | 722 | 1011010010 | 5 | 7 | 10 | 182 | 403 | 0110010011 | 5 | 5 | 10 | 403 | 0110010011 | 5 | 5 | 10 |
| 149 | 810 | 1100101010 | 5 | 7 | 10 | 850 | 1101010010 | 5 | 7 | 10 | 183 | 614 | 1001100110 | 5 | 5 | 10 | 614 | 1001100110 | 5 | 5 | 10 |
| 150 | 850 | 1101010010 | 5 | 7 | 10 | 850 | 1101010010 | 5 | 7 | 10 | 184 | 716 | 1011001100 | 5 | 5 | 10 | 716 | 1011001100 | 5 | 5 | 10 |
| 151 | 347 | 0101011011 | 6 | 7 | 10 | 676 | 1010100100 | 4 | 7 | 10 | 185 | 812 | 1100101100 | 5 | 5 | 10 | 812 | 1100101100 | 5 | 5 | 10 |
| 152 | 365 | 0101101101 | 6 | 7 | 10 | 658 | 1010010010 | 4 | 7 | 10 | 186 | 820 | 1100110100 | 5 | 5 | 10 | 820 | 1100110100 | 5 | 5 | 10 |
| 153 | 429 | 0110101101 | 6 | 7 | 10 | 594 | 1001010010 | 4 | 7 | 10 | 187 | 868 | 1101100100 | 5 | 5 | 10 | 868 | 1101100100 | 5 | 5 | 10 |
| 154 | 694 | 1010110110 | 6 | 7 | 10 | 329 | 0101001001 | 4 | 7 | 10 | 188 | 411 | 0110011011 | 6 | 5 | 10 | 612 | 1001100100 | 4 | 5 | 10 |
| 155 | 730 | 1011011010 | 6 | 7 | 10 | 293 | 0100100101 | 4 | 7 | 10 | 189 | 822 | 1100110110 | 6 | 5 | 10 | 201 | 0011001001 | 4 | 5 | 10 |
| 156 | 858 | 1101011010 | 6 | 7 | 10 | 165 | 0010100101 | 4 | 7 | 10 | 190 | 876 | 1101101100 | 6 | 5 | 10 | 147 | 0010010011 | 4 | 5 | 10 |
| 157 | 182 | 0010110110 | 5 | 6 | 10 | 182 | 0010110110 | 5 | 6 | 10 | 191 | 343 | 0101010111 | 6 | 7 | 10 | 680 | 1010101000 | 4 | 7 | 7 |
| 158 | 218 | 0011011010 | 5 | 6 | 10 | 218 | 0011011010 | 5 | 6 | 10 | 192 | 373 | 0101110101 | 6 | 7 | 10 | 650 | 1010001010 | 4 | 7 | 7 |
| 159 | 358 | 0101100110 | 5 | 6 | 10 | 358 | 0101100110 | 5 | 6 | 10 | 193 | 686 | 1010101110 | 6 | 7 | 10 | 337 | 0101010001 | 4 | 7 | 7 |
| 160 | 406 | 0110010110 | 5 | 6 | 10 | 406 | 0110010110 | 5 | 6 | 10 | 194 | 746 | 1011101010 | 6 | 7 | 10 | 277 | 0100010101 | 4 | 7 | 7 |
| 161 | 422 | 0110100110 | 5 | 6 | 10 | 422 | 0110100110 | 5 | 6 | 10 | 195 | 174 | 0010101110 | 5 | 6 | 7 | 174 | 0010101110 | 5 | 6 | 7 |
| 162 | 434 | 0110110010 | 5 | 6 | 10 | 434 | 0110110010 | 5 | 6 | 10 | 196 | 234 | 0011101010 | 5 | 6 | 7 | 234 | 0011101010 | 5 | 6 | 7 |
| 163 | 587 | 1001001011 | 5 | 6 | 10 | 587 | 1001001011 | 5 | 6 | 10 | 197 | 314 | 0100111010 | 5 | 6 | 7 | 314 | 0100111010 | 5 | 6 | 7 |
| 164 | 595 | 1001010011 | 5 | 6 | 10 | 595 | 1001010011 | 5 | 6 | 10 | 198 | 348 | 0101011100 | 5 | 6 | 7 | 348 | 0101011100 | 5 | 6 | 7 |
| 165 | 613 | 1001100101 | 5 | 6 | 10 | 613 | 1001100101 | 5 | 6 | 10 | 199 | 372 | 0101110100 | 5 | 6 | 7 | 372 | 0101110100 | 5 | 6 | 7 |
| 166 | 659 | 1010010011 | 5 | 6 | 10 | 659 | 1010010011 | 5 | 6 | 10 | 200 | 466 | 0111010010 | 5 | 6 | 7 | 466 | 0111010010 | 5 | 6 | 7 |
| 167 | 713 | 1011001001 | 5 | 6 | 10 | 713 | 1011001001 | 5 | 6 | 10 | 201 | 555 | 1000101011 | 5 | 6 | 7 | 555 | 1000101011 | 5 | 6 | 7 |
| 168 | 809 | 1100101001 | 5 | 6 | 10 | 809 | 1100101001 | 5 | 6 | 10 | 202 | 565 | 1000110101 | 5 | 6 | 7 | 565 | 1000110101 | 5 | 6 | 7 |
| 169 | 438 | 0110110110 | 6 | 6 | 10 | 585 | 1001001001 | 4 | 6 | 10 | 203 | 653 | 1010001101 | 5 | 6 | 7 | 653 | 1010001101 | 5 | 6 | 7 |

FIG. 7

| STEP | MAP 1 | | | | MAP 2 | | | |
|---|---|---|---|---|---|---|---|---|
| | DECIMAL | CODE | ISUM | DV | IW | DECIMAL | CODE | ISUM | DV | IW |

| STEP | MAP 1 DECIMAL | MAP 1 CODE | ISUM | DV | IW | MAP 2 DECIMAL | MAP 2 CODE | ISUM | DV | IW |
|---|---|---|---|---|---|---|---|---|---|---|
| 204 | 689 | 1010110001 | 5 | 6 | 7 | 689 | 1010110001 | 5 | 6 | 7 |
| 205 | 721 | 1011010001 | 5 | 6 | 7 | 721 | 1011010001 | 5 | 6 | 7 |
| 206 | 837 | 1101000101 | 5 | 6 | 7 | 837 | 1101000101 | 5 | 6 | 7 |
| 207 | 366 | 0101101110 | 6 | 6 | 7 | 657 | 1010010001 | 4 | 6 | 7 |
| 208 | 430 | 0110101110 | 6 | 6 | 7 | 593 | 1001010001 | 4 | 6 | 7 |
| 209 | 470 | 0111010110 | 6 | 6 | 7 | 553 | 1000101001 | 4 | 6 | 7 |
| 210 | 599 | 1001010111 | 6 | 6 | 7 | 424 | 0110101000 | 4 | 6 | 7 |
| 211 | 629 | 1001110101 | 6 | 6 | 7 | 394 | 0110001010 | 4 | 6 | 7 |
| 212 | 669 | 1010011101 | 6 | 6 | 7 | 354 | 0101100010 | 4 | 6 | 7 |
| 213 | 697 | 1010111001 | 6 | 6 | 7 | 326 | 0101000110 | 4 | 6 | 7 |
| 214 | 745 | 1011101001 | 6 | 6 | 7 | 278 | 0100010110 | 4 | 6 | 7 |
| 215 | 933 | 1110100101 | 6 | 6 | 7 | 90 | 0001011010 | 4 | 6 | 7 |
| 216 | 91 | 0001011011 | 5 | 5 | 7 | 91 | 0001011011 | 5 | 5 | 7 |
| 217 | 109 | 0001101101 | 5 | 5 | 7 | 109 | 0001101101 | 5 | 5 | 7 |
| 218 | 157 | 0010011101 | 5 | 5 | 7 | 157 | 0010011101 | 5 | 5 | 7 |
| 219 | 185 | 0010111001 | 5 | 5 | 7 | 185 | 0010111001 | 5 | 5 | 7 |
| 220 | 233 | 0011101001 | 5 | 5 | 7 | 233 | 0011101001 | 5 | 5 | 7 |
| 221 | 295 | 0100100111 | 5 | 5 | 7 | 295 | 0100100111 | 5 | 5 | 7 |
| 222 | 355 | 0101100011 | 5 | 5 | 7 | 355 | 0101100011 | 5 | 5 | 7 |
| 223 | 397 | 0110001101 | 5 | 5 | 7 | 397 | 0110001101 | 5 | 5 | 7 |
| 224 | 433 | 0110110001 | 5 | 5 | 7 | 433 | 0110110001 | 5 | 5 | 7 |
| 225 | 566 | 1000110110 | 5 | 5 | 7 | 566 | 1000110110 | 5 | 5 | 7 |
| 226 | 604 | 1001011100 | 5 | 5 | 7 | 604 | 1001011100 | 5 | 5 | 7 |
| 227 | 628 | 1001110100 | 5 | 5 | 7 | 628 | 1001110100 | 5 | 5 | 7 |
| 228 | 710 | 1011000110 | 5 | 5 | 7 | 710 | 1011000110 | 5 | 5 | 7 |
| 229 | 740 | 1011100100 | 5 | 5 | 7 | 740 | 1011100100 | 5 | 5 | 7 |
| 230 | 794 | 1100011010 | 5 | 5 | 7 | 794 | 1100011010 | 5 | 5 | 7 |
| 231 | 856 | 1101011000 | 5 | 5 | 7 | 856 | 1101011000 | 5 | 5 | 7 |
| 232 | 872 | 1101101000 | 5 | 5 | 7 | 872 | 1101101000 | 5 | 5 | 7 |
| 233 | 916 | 1110010100 | 5 | 5 | 7 | 916 | 1110010100 | 5 | 5 | 7 |
| 234 | 183 | 0010110111 | 6 | 5 | 7 | 840 | 1101001000 | 4 | 5 | 7 |
| 235 | 215 | 0011010111 | 6 | 5 | 7 | 808 | 1100101000 | 4 | 5 | 7 |
| 236 | 235 | 0011101011 | 6 | 5 | 7 | 788 | 1100010100 | 4 | 5 | 7 |
| 237 | 311 | 0100110111 | 6 | 5 | 7 | 712 | 1011001000 | 4 | 5 | 7 |
| 238 | 359 | 0101100111 | 6 | 5 | 7 | 664 | 1010011000 | 4 | 5 | 7 |
| 239 | 407 | 0110010111 | 6 | 5 | 7 | 616 | 1001101000 | 4 | 5 | 7 |
| 240 | 423 | 0110100111 | 6 | 5 | 7 | 600 | 1001011000 | 4 | 5 | 7 |
| 241 | 459 | 0111001011 | 6 | 5 | 7 | 564 | 1000110100 | 4 | 5 | 7 |
| 242 | 467 | 0111010011 | 6 | 5 | 7 | 556 | 1000101100 | 4 | 5 | 7 |
| 243 | 622 | 1001101110 | 6 | 5 | 7 | 401 | 0110010001 | 4 | 5 | 7 |
| 244 | 718 | 1011001110 | 6 | 5 | 7 | 305 | 0100110001 | 4 | 5 | 7 |
| 245 | 742 | 1011100110 | 6 | 5 | 7 | 281 | 0100011001 | 4 | 5 | 7 |
| 246 | 814 | 1100101110 | 6 | 5 | 7 | 209 | 0011010001 | 4 | 5 | 7 |
| 247 | 846 | 1101001110 | 6 | 5 | 7 | 177 | 0010110001 | 4 | 5 | 7 |
| 248 | 882 | 1101110010 | 6 | 5 | 7 | 141 | 0010001101 | 4 | 5 | 7 |
| 249 | 918 | 1110010110 | 6 | 5 | 7 | 105 | 0001101001 | 4 | 5 | 7 |
| 250 | 934 | 1110100110 | 6 | 5 | 7 | 89 | 0001011001 | 4 | 5 | 7 |
| 251 | 946 | 1110110010 | 6 | 5 | 7 | 77 | 0001001101 | 4 | 5 | 7 |
| 252 | 206 | 0011001110 | 5 | 4 | 7 | 206 | 0011001110 | 5 | 4 | 7 |
| 253 | 230 | 0011100110 | 5 | 4 | 7 | 230 | 0011100110 | 5 | 4 | 7 |
| 254 | 412 | 0110011100 | 5 | 4 | 7 | 412 | 0110011100 | 5 | 4 | 7 |
| 255 | 563 | 1000110011 | 5 | 4 | 7 | 563 | 1000110011 | 5 | 4 | 7 |

METHOD AND APPARATUS FOR REDUCING DC COMPONENTS IN A DIGITAL INFORMATION SIGNAL

BACKGROUND OF THE INVENTION

1. Field of the Invention

This invention relates generally to a method and apparatus for reducing DC components in a digital information signal and, more particularly, is directed to a method and apparatus for reducing DC components in a digital information signal comprised of a plurality of N-bit data words by converting each of the N-bit data words to an M-bit data word.

2. Description of the Prior Art

It is known in the art of recording an information signal, such as a video or audio signal, on a recording medium, to convert the information signal in analog form to a digital information signal by means of pulse code modulation (PCM). The digital information signal is recorded on or reproduced from the recording medium, such as a magnetic tape, by rotating magnetic heads, and a rotary transformer is often used for supplying the digital information signal to or for receiving the reproduced information signal from the magnetic heads. However, the rotary transformer cannot transmit DC components of the digital information signal so that some of the information may be lost.

It has therefore been proposed to code the digital video signal to reduce the DC components thereof. In order to minimize the DC components of the digital information signal, the "0" and "1" bits of the digital signal are preferably arranged in a frequently occurring alternating sequence. Such alternation makes synchronous extraction of the signal during the reproduction operation easier, in addition to overcoming the above-described difficulties encountered with the rotary transformer. In other words, the separation of the information or data signals from the synchronizing signals during reproduction becomes exceedingly difficult if either of the "0" or "1" pulses is of a relatively long duration.

Further, it is desirable for the digital signal which is to be recorded to have the frequency spectrum thereof concentrated so as to prevent the occurrence of a so-called "peak shift" phenomenon. Such phenomenon results when a single-bit phase follows a relatively long duration pulse in the digital information signal whereby the signal corresponding to the single-bit pulse has its peak shifted during reproduction. It should be appreciated that the occurrence of such peak shift results in erroneous detection and reproduction of the recorded digital information signal. To avoid such "peak shift" phenomenon, it is desirable for the digital information signal to have frequent alternations of "1" and "0" bits. In other words, it is desirable that the levels of "1" and "0" have similar periods so as to concentrate the frequency spectrum of the digital information signal.

In order to minimize the DC components and concentrate the frequency spectrum of the digital information signal, various code conversion systems have been proposed which, for example, convert a digital signal comprised of 8-bit words to a digital signal comprised of a 10-bit words. The 8-bit word code is comprised of $2^8$ or 256 possible 8-bit words and the 10-bit word code is comprised of $2^{10}$ or 1,024 possible 10-bit words. In order to maximize the frequency of alternation of the "1" and "0" bits, known 8-to-10 code conversion systems have primarily used 10-bit words having five "0" bits and five "1" bits in the conversion process. However, of the possible 1,024 possible combinations, there exist only 252 10-bit words having five "0" bits and five "1" bits. Accordingly, at least four 10-bit words in which the difference between the number of "1" bits and "0" bits is two, for example, the words [1010101011] and [0101010100], must be added to the aforementioned set of 252 10-bit words during the coding process to complete the code map for all 256 combinations of the 8-bit word code.

However, although known 8-to-10 code conversion systems at least partially remove the DC components from the digitial information signal, such systems do not take into consideration the degree of concentration of the frequency spectrum of the digital information signal. For example, of the 256 possible 10-bit words in the cope map, there are included words of a relatively long-pulse duration [1111100000], that is, words having a long run length, in addition to words of a relatively short-pulse duration [1010101010] having a short run length. This means that a short-pulse duration word may follow a long-pulse duration word whereby to produce the aforementioned peak shift phenomenon, resulting in errors in the reproduced digital information signal.

OBJECTS AND SUMMARY OF THE INVENTION

Accordingly, it is an object of this invention to provide a method and apparatus of reducing DC components in a digital information signal comprised of a plurality of N-bit data words that avoids the above-described difficulties encountered with the prior art.

More particularly, it is an object of this invention to provide a method and apparatus for reducing DC components in a digital information signal comprised of a plurality of M-bit data words by converting each of the N-bit data words to a respective M-bit data word.

It is another object of this invention to provide a method and apparatus for reducing DC components in a digital information signal comprised of a plurality of N-bit data words which minimizes the so-called "peak shift" phenomenon.

It is still another object of this invention to provide a method and apparatus for reducing DC components in a digital information signal comprised of a plurality of N-bit data words which concentrates the frequency spectrum of the digital information signal.

It is yet another object of this invention to provide a method and apparatus for reducing DC components in a digital information signal comprised of a plurality of N-bit data words by converting each of the N-bit data words to a respective M-bit data word in accordance with the generation frequency of the N-bit data words and the weight of the M-bit data words.

It is a further object of this invention to provide a method and apparatus for reducing DC components in a digital information signal comprised of a plurality of N-bit data words in which each of the N-bit data words is converted to a respective M-bit data word in accordance with the generation frequency of the N-bit data words and the weight of the M-bit data words so that N-bit data words having a high generation frequency are converted to M-bit data words having a short run length.

In accordance with an aspect of this invention, a method of reducing DC components in a digital information signal comprised of a plurality of N-bit data words by converting each of the N-bit data words to a respective one of M-bit data words, comprises the steps of grouping the M-bit data words by weight in accordance with the run length of data of each M-bit data word; and assigning each of the N-bit data words to a respective one of the M-bit data words in accordance with the generation frequency of the N-bit data words so that N-bit data words having a high generation frequency are assigned to M-bit data words having a short run length.

In addition, in accordance with a further apsect of this invention, the M-bit data words are grouped into two coding maps, one of the maps including M-bit data words having the number of "1" bits equal to or greater than the number of "0" bits, and the other map including M-bit data words, having the number of "1" bits equal to or less than the number of "0" bits, with each map including $2^N$ M-bit data words.

The above, and other, objects, features and advantages of the invention, will be apparent in the following detailed description of an illustrative embodiment of the invention which is to be read in connection with the accompanying drawings.

BRIEF DESCRIPTION OF THE DRAWINGS

FIGS. 4–7 are numerical tables used for explaining the mapping technique used with the method for reducing DC components in a digital information signal according to this invention;

DETAILED DESCRIPTION OF THE PREFERRED EMBODIMENT

Figure 2:
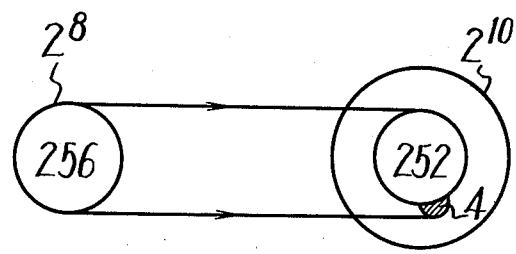
FIG. 2 is a schematic representation used for explaining known 8-to-10 conversion systems.
Figure 3:
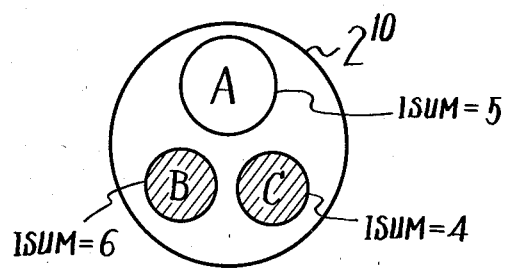
FIG. 3 is a schematic representation used for explaining an aspect of the method for reducing DC components in a digital information signal according to this invention.

Referring to the figures in detail, and initially to FIG. 2 thereof, there is illustrated therein an 8-to-10 code conversion method according to the prior art. With such method, a pulse code modulated (PCM) digital information signal, such as a digital video signal to be recorded by a video tape recorder (VTR) or the like, is sampled every 8-bits so as to form a plurality of 8-bit digital data words. By means of the aforementioned 8-to-10 code conversion method, each 8-bit word is converted to a corresponding 10-bit word to minimize the DC components of the digital information signal. In particular, in order to minimize the DC components, the digital information signal is preferably arranged to have frequent alternations of the "1" and "0" bits. This provides for easy synchronous extraction of the information signal during reproduction. Further, in the instance where a rotary transformer is used with rotating magnetic heads for recording and reproducing the information signal on a magnetic tape, such frequent alternation of "1" and "0" bits assures that the entire information signal will be substantially transmitted through the rotary transformer to and from the rotating magnetic heads.

In the known 8-to-10 code conversion method shown in FIG. 2, the possible combinations of 10bit words is equal to $2^{10}$ or 1,024 and the possible combinations of 8-bit data words is equal to $2^8$ or 256. Conventionally, known 8-to-10 code conversion methods have attempted to provide equal numbers of "1" and "0" bits in each 10-bit word in order to provide maximum alternation of the "1" and "0" bits, while also providing a total number of "1" and "0" bits in the digital information signal that are equal, whereby to reduce the DC components in the digital information signal. However, in the 10-bit word code, there exist only 252 possible combinations of words having five "1" bits and five "0" bits, as represented by the inner circle in the 10-bit word code map of FIG. 2. Thus, four additional 10-bit words comprised of unequal numbers of "1" and "0" bits, for example, the words [1010101011] and [0101010100], must be added to the aforementioned 252 10-bit words for completing the code map.

Figure 1:
FIG. 1 is a waveform diagram used for illustrating the peak shift phenomenon which occurs with known 8-to-10 code conversion systems.

In addition to reducing the DC components in the digital information signal, it is also desirable to concentrate the frequency spectrum of the digital information signal so as to minimize the so-called "peak shift" phenomenon. Such phenomenon occurs when a single-bit pulse follows a relatively long duration pulse whereby the signal corresponding to the single-bit pulse has its peak level shifted during reproduction. For example, as shown in FIG. 1, a single-bit pulse indicated by an asterisk is shown to follow a relatively long duration pulse and the signal corresponding to such single-bit pulse has its peak value shifted during the reproducting operation. Such shift in the peak value results in an erroneous detection and reproduction of the information signal. To avoid such phenomenon, it is preferable that the coded data have frequent alternations of "1" and "0" bits, which result in concentration of the frequency spectrum of the digital information signal. However, with the aforementioned 8-to-10 code conversion method, 10-bit words having pulses of a relatively long duration, for example, [1111100000], are utilized along with short duration pulse words, for example [1010101010]. Thus, although such coding system operates to minimize the DC components of the digital information signal, such conversion method does not fully take into consideration the concentration of the frequency spectrum. For example, it is possible that the above-mentioned long duration pulse word [1111100000] may precede the short duration pulse word [1010101010] and thereby produce the aforementioned "peak shift" phenomenon.

Referring now to FIGS. 3–10, there is illustrated therein a method and apparatus for reducing the DC components in a digital information signal according to this invention in which the digital information signal is comprised of a plurality of 8-bit data words and each of the 8-bit data words is converted to a respective 10-bit data word. First, it should be appreciated that there exist 1,024 possible 10-bit words from which 256 8-bit words must be selected. Rather than merely utilizing all 252 combinations of 10-bit words hving an equal number of "1" and "0" bits, the present invention uses a priority or weighting system, taking into consideration three distinct characteristics of each 10-bit word. In particular, IDV represents the number of boundaries between adjacent "0" and "1" bits; ISUM represents the number of "1" bits in each 10-bit word; and IW represents the "weight" of each 10-bit word. The weighting term IW is comprised of two quantities, IW1 and IW2. IW1 represents the number of isolated bits of "1" and "0", that is, the number of "1" bits which are bordered on both sides by a "0" bit and the number of "0" bordered on both sides by a "1" bit. IW2 represents the number of isolated pairs of "1" bits [11] bordered on both sides by a "0" bit and the number of isolated pairs of "0" bits ]00] bordered on both sides by a "1" bit. In addition, the IW1 term is weighted by a factor of 1 and the IW2 term is weighted by a factor of 2 so that $IW = 1 \times IW1 = 2 + IW2$.

For example, in the 10-bit word 1110010100, the number of boundaries between "0" and "1" bits, that is, IDV, is equal to 5 and the value of ISUM is equal to 5. The value of IW1 is equal to 3 which is obtained as follows and identified by the gruping in parentheses: 11100(1)(0)(1)00. In like manner, the value of IW2 is equal to 2 which is obtained as follows and identified by the grouping in parentheses: 111(00)101(00). It should be appreciated that the triplet "1" bits ]111], that is, the three most significant bits of the 10-bit word, do not count in the value of IW2 since any two of the bits are bounded on one side by a "1" bit whereby any two bits are not isolated. Thus, $IW = 1 \times IW1 + 2 \times IW2 = 1 \times 3 + 2 \times 2 = 7$. In accordance with a further illustration, in the 10-bit word 1100010111, IDV=4, ISUM=6, and $IW = 1 \times 2 + 2 \times 1 = 4$, in which IW 1 has a value of 2, which is obtained as follows in accordance with the grouping of paranthesis: 11000(1)(0)111; and IW2 has a value of 1, which is obtained as follows in accordance with the grouping by parenthesis: (11)00010111. Accordingly, each of the 1,024 10-bit words is given a value of IDV, ISUM and IW. It should be appreciated that each of the terms IDV, ISUM and IW is related to the run length of data of each 10-bit word, where the run length is defined as the number of consecutive bits of the same logic level.

From the $2^{10}$ or 1,024 10-bit words, each having respective values of IDV, ISUM and IW, 256 10-bit words are selected as follows: First, 10-bit code words having a maximum value of IW are selected, for example, IW = 10. From these latter words, 10-bit words are selected in the order of decreasing values of IDV, such as 9, 8, 7, 6 and 5, each of the groups of words having a specific IDV value being further arranged in priority by 10-bit words having ISUM values of 5 and then 6. In other words, for each value of IDV, in descending order, words having ISUM values of 5 and then 6 are chosen. In particular, the 10-bit code words are chosen in accordance with the following table until 256 of such words are obtained:

| IW | IDV | ISUM |
|---|---|---|
| 10 | 9 | 5 |
| 10 | 8 | 5 |
| 10 | 8 | 6 |
| 10 | 7 | 5 |
| 10 | 7 | 6 |
| 10 | 6 | 5 |
| 10 | 6 | 6 |
| 10 | 5 | 5 |
| 10 | 5 | 6 |
| 7 | 7 | 6 |
| 7 | 6 | 5 |
| 7 | 6 | 6 | and so on. It should be appreciated that words having certain combinations of IW, IDV and ISUM are nonexistent and are not included in the above table, for example, 10-bit words having values of IW equal to 10, IDV equal to 9 and ISUM equal to 6. Accordingly, 256 10-bit code words are grouped in accordance with the priority or weight thereof where such weighting is based on the run length of the words. It should thus be appreciated that 256 10-bit code words are formed comprised of words having five "1" bits and five "0" bits (ISUM = 5) and words having six "1" bits and four "0" bits (ISUM = 6).

Further, in accordance with the present invention, the selected 10-bit words having six "1" bits (ISUM = 6) are inverted to form words having four "1" bits, that is, words having an ISUM value of 4, the purpose for which will hereinafter be described. Accordingly, three groups of 10-bit words are formed with ISUM values of 5, 6 and 4 as represented by groups A, B and C, respectively, in FIG. 3. It should be appreciated that the total number of 10-bit words in the A and B groups total 256 in accordance with the above priority system. Further, since the words in group C are obtained by inverting the words in group B, the total number of words in combined groups A and C is also 256 so that $A + B = 256 = A + C$.

Figure 10:
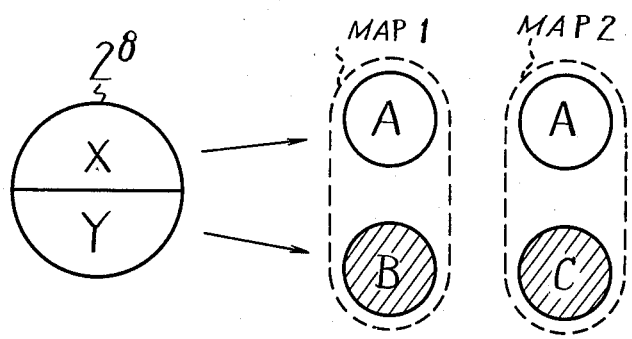
FIG. 10 is a schematic representation used for explaining the mapping technique used with the method for reducing DC components in a digital information signal according to this invention.
Figure 8:
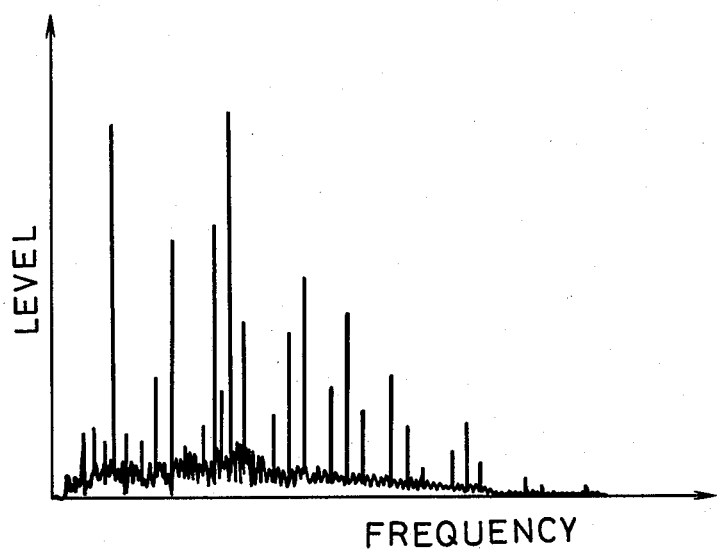
FIG. 8 is a graphical diagram illustrating the concentration of the frequency spectrum resulting from known 8-to-10 code conversion systems.
Figure 9:
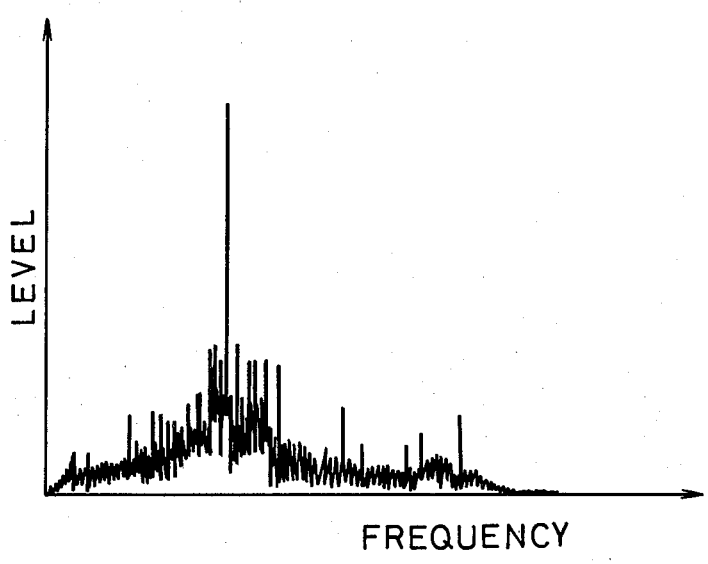
FIG. 9 is a graphical diagram illustrating the concentrated frequency spectrum resulting from the method for reducing DC components in a digital information signal according to this invention.

In accordance with this invention, the A and B groups are mapped into a map 1 and the A and C groups are mapped into a map 2, as shown in FIG. 10, with each map consisting of 256 10-bit words and with the A group being common to both maps. In particular, the 10-bit code words having ISUM values of 5 are assigned to both maps 1 and 2 for the same 8-bit data words, that is, for certain quantized levels of the input signal. However, for 10-bit code words having an ISUM value of 6 which are assigned to map 1, 10-bit code words having an ISUM value of 4 which are complementary or inverted from the aforementioned code words having an ISUM value of 6, are assigned to map 2 for the same 8-bit data words or quantized levels. Consequently, map 1 includes a total of 256 10-bit code words having ISUM values of 5 and 6 which correspond to quantized levels of the information signal from 0 to 255 and map 2 includes a total of 256 10-bit code words having ISUM values of 5 and 4 and which also correspond to quantized levels of the information signal from 0 to 255.

The 256 8-bit data words are each assigned to respective 10-bit data words in accordance with the generation frequency, that is, frequency of occurrence, of each 8-bit data word and the priority or weighting of each 10-bit data word. In particular, it has been found, upon examination of the frequency of occurrence (generation frequency) of various sampled quantized levels per frame of, for example, a digital video signal, that intermediate quantized levels occur most frequently, that is, have a maximum generation frequency and smaller and larger quantized levels occur at a lower generation frequency. It should be appreciated that, although the distribution of signals having various quantized levels depends on the picture information, such distribution is substantially identical for the entire video picture, including people, scenes or the like. Accordingly, in order to minimize the DC components in the information signal, quantized levels in the 8-bit code information signal which occur more frequently, that is, that have a high generation frequency, are converted to 10-bit code words having a higher priority. In other words, 8-bit data words having a high generation frequency are converted to 10-bit code words having large values of IW and IDV and an ISUM value of 5. For example, as shown in FIGS. 4–7, the 8-bit data words having the highest generation frequency, that is, intermediate levels 127 and 128, are assigned the most preferential 10-bit code words [0101010101] and [1010101010], respectively. It should be appreciated that such 10-bit code words have an IW value of 10, an IDV of 9 and an ISUM value of 5. The 8-bit data words having quantized levels further removed from the intermediate levels of 127 and 128 are converted to less preferential 10-bit code words in accordance with the priority order given by the table.

It should be appreciated that the selected 256 10-bit words having ISUM values of 5 and 6 are thus grouped in map 1 in accordance with the generation frequency of each 8-bit data word and the priority or weighting of each 10-bit data word. The corresponding 10-bit words assigned to map 2 are obtained from the 10-bit code words in map 1 for the same quantized levels. Thus, for 10-bit code words having an ISUM value of 5, the same 10-bit code words are used in maps 1 and 2. When the ISUM value of the 10-bit code words in map 1 is equal to 6, these code words are inverted to form respective code words having an ISUM value of 4 which are used in map 2 for the same quantized levels. For example, the following values serve to illustrate the above mapping technique:

| QUANTIZED LEVEL | MAP 1 | MAP 2 | ISUM |
|---|---|---|---|
| 75 | 0011001011 | 0011001011 | 5 |
| 81 | 1011011001 | 0100100110 | 6 (Map 1) |
|  |  |  | 4 (Map 2) |

Referring now to FIG. 10, there is shown at the left side of the figure, a schematic representation of the 256 or $2^8$ 8-bit data words, comprised of two groups, X and Y, containing such 8-bit data words, where X=[X1,X2, ... Xl] and Y=[Y1,Y2, ... Yk]. Group X includes 8-bit data words which have been assigned 10-bit data words having an ISUM value of 5, in accordance with the generation frequency of the 8-bit data words and the weighting of the 10-bit data words. In like manner, group Y includes 8-bit data words which have been assigned 10-bit data words having an unequal number of "1" and "0" bits. Maps 1 and 2 are shown to be comprised of groups A and B and groups A and C, respectively, where A=[A1,A2, ... Al], B=[B1,B2, ... Bk] and C=[C1,C2, ... Ck]. It should be appreciated that 1+k=256 whereby the 8-bit data words in group X are converted to 10-bit code words in group A and the 8-bit data words in group Y are converted to 10-bit data words in groups B and C.

It is desirable that the digital information signal comprised of a plurality of 8-bit data words be converted into a digital signal comprised of a plurality of 10-bit data words in which the converted information signal includes an equal number of "1" and "0" bits in the entire signal. Thus, for example, if all 8-bit data words from group Y are converted to 10-bit data words from only group B, where each 10-bit code word in the latter group includes six "1" bits and four "0" bits, an unequal number of "1" bits will result in the coded digital signal. Therefore, in order to provide an equal number of "1" and "0" bits so as to minimize the DC components in the digital information signal, the following method is utilized. When an 8-bit code word from group X is converted to a 10-bit code word from group A, such 10-bit code word may be selected from either of maps 1 or 2 since the 10-bit code words having an ISUM value of 5 in both maps are identical. However, the selection of 10-bit code words corresponding to the 8-bit code words from group Y, are alternately selected from groups B and C. Since code words from group B have an ISUM value of 6 while code words from group C have an ISUM value of 4, such alternate arrangement provides an equal number of "1" and "0" bits in the entire digital information signal. Such method is more clearly seen in the following illustrative conversion table in which the 10-bit code words from groups A, B and C and the corresponding 8-bit data words from groups X and Y include a numerical suffix which is indicative of the timing of the signals.

| X1 | X2 | Y3 | X4 | X5 | X6 | Y7 | Y8 | Y9 | X10 | X11 |
|---|---|---|---|---|---|---|---|---|---|---|
| ↓ | ↓ | ↓ | ↓ | ↓ | ↓ | ↓ | ↓ | ↓ | ↓ | ↓ |
| A1 | A2 | B3 | A4 | A5 | A6 | C7 | B8 | C9 | A10 | A11 |
| Map 1 |  | Map 2 |  |  |  |  | Map 1 | Map 2 |  | Map 1 |

It should thus be appreciated that the alternate use of maps 1 and 2 achieves a reduction of the DC components in the digital information signal even though 10-bit code words having an ISUM value not equal to 5 are used.

Figure 11:
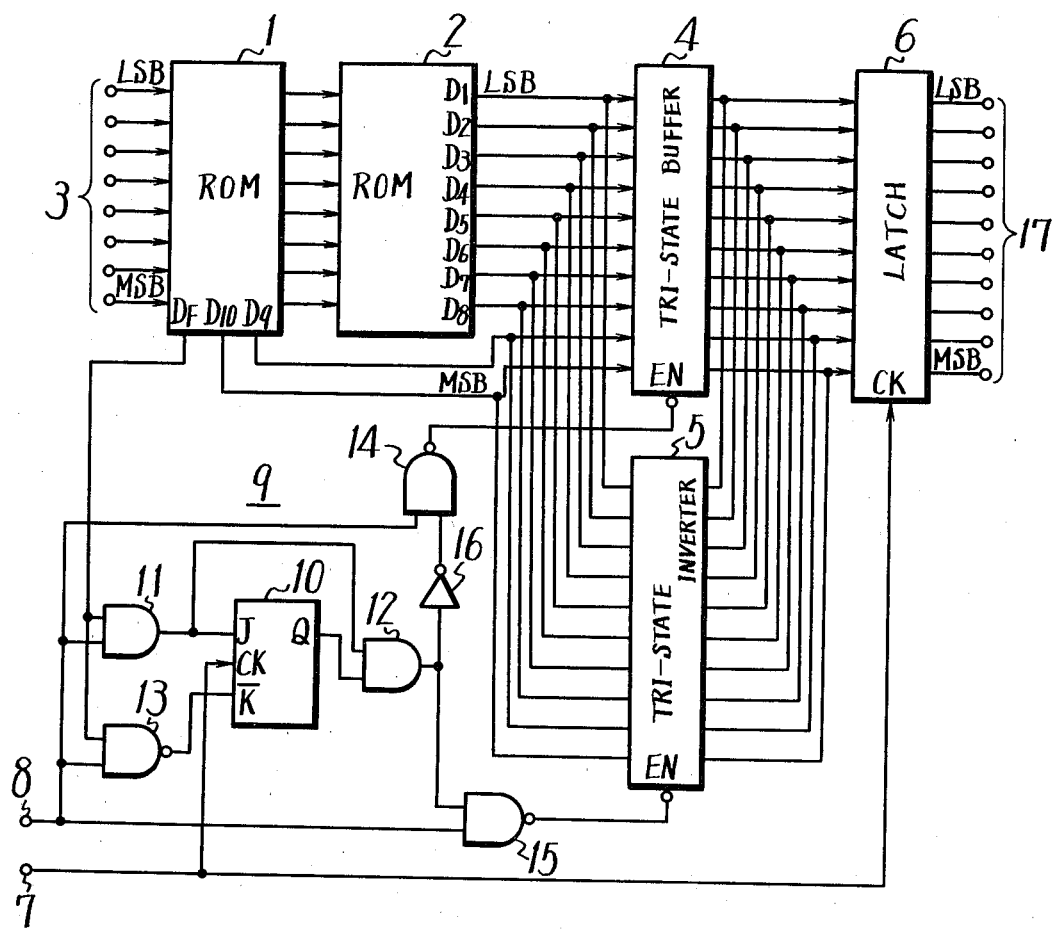
FIG. 11 is a block diagram of an apparatus for reducing DC components in a digital information signal according to this invention.

Referring now to FIG. 11, there is shown an apparatus according to this invention for selecting the 10-bit words from either of maps 1 or 2, for example, as shown in the above table. As shown therein, the apparatus includes read-only memories (ROM) 1 and 2 in which the 10-bit code words from map 1 have previously been stored. It should be appreciated that a single ROM having a sufficiently large memory capacity may be substituted for ROMs 1 and 2. ROMs 1 and 2 have an input terminal 3 supplied with the 8-bit digital information words from groups X and Y and, in response thereto, ROMs 1 and 2 generate corresponding 10-bit digital information words from groups A and B at output terminals D1 to D10 thereof. It is to be appreciated that the 10-bit digital information words at output terminals D1 to D10, however, only include signals from map 1. ROM 1 further includes a flag terminal $D_F$ which produces a logic level "1" signal when the generated 10-bit word therefrom has an ISUM value of 6. When the number of "1" and "0" bits in the word supplied to output terminals D1 to D10 are equal, that is, when ISUM=5, a logic level "0" signal is produced at flag terminal $D_F$.

The apparatus of FIG. 11 further includes a tri-state buffer circuit 4 and a tri-state inverter circuit 5. Buffer circuit 4 is adapted to supply the coded 10-bit word from ROMs 1 and 2 directly to a latch circuit 6 and inverter circuit 5 is adapted to invert the output from ROMs 1 and 2 and supply such inverted output to latch circuit 6. Buffer circuit 4 and inverter circuit 5 each include an enable input EN whereby such circuits are enabled when a logic level "0" signal is supplied to the respective enable inputs EN thereof.

Figure 12A:
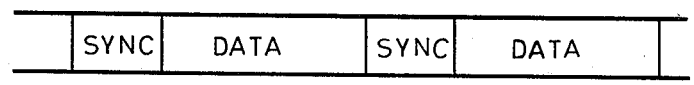
FIGS. 12A and 12B are waveform diagrams used for explaining the method of extracting the data information from a received digital signal for use in the apparatus of FIG. 11.
Figure 12B:

The actuation of circuits 4 and 5 is controlled by a gate circuit 9. In particular, gate circuit 9 includes a two-input AND gate 11 supplied with the output from flag terminal $D_F$ at one input thereof and with a data pickup pulse at the other input thereof from an input terminal 8. The data pickup pulse (FIG. 12B) operates to separate the data signal DATA from the synchronizing signal SYNC (FIG. 12A). The output of AND gate 11 is supplied to the J input terminal of a J-K flip-flop circuit 10 also included in gate circuit 9 and is further supplied to one input of a two-input AND gate 12. J-K flip-flop circuit 10 is preferably of the type described in Texas Instrument's IC Manual (SN74109) and has a J input terminal and an inverting $\overline{K}$ input terminal. Thus, when a logic level "1" signal is supplied to the J input terminal and a logic level "0" signal is supplied to the $\overline{K}$ input terminal, the flip-flop circuit operates in its toggle mode to reverse the logic level of the output therefrom during the next time period. When the signals supplied to the J and $\overline{K}$ input terminals are at logic level "0" and "1", respectively, the output of flip-flop circuit 10 does not change during the next time period. A two-input NAND gate 13 is also supplied with the output from flag terminal $D_F$ at one input thereof and with the data pickup pulse at the other input terminal thereof and supplies an output to the inverting $\overline{K}$ input terminal of J-K flip-flop circuit 10. In addition, a clock pulse from a master clock (not shown) is supplied from an input terminal 7 to the clock input of J-K flip-flop circuit 10 as the clock signal therefor. Such clock pulse is synchronized with the 8-bit word supplied to input terminal 3 and preferably operates to trigger flip-flop circuit 10 at the positive-going edges thereof. J-K flip-flop circuit 10 produces an output at its Q output terminal which is supplied to the other input of AND gate 12. The output of AND gate 12 is supplied through an inverter 16 to one input of a two-input NAND gate 14 and the data pickup pulse is supplied to the other input of NAND gate 14, whereby NAND gate 14 produces an output which is supplied to the enabling input EN of buffer circuit 4. In addition, the output of AND gate 12 is supplied to one input of a two-input NAND gate 15 and the data pickup pulse is supplied to the other input of NAND gate 15 which, in turn, supplies an output to the enabling input EN of inverter circuit 5. Lastly, the clock pulse from input terminal 7 is supplied to a clock input of latch circuit 6 for synchronizing the operation of this circuit with gating circuit 9.

In operation, when an 8-bit digital information word from group X is supplied to input terminal 3 of ROMs 1 and 2, flag terminal $D_F$ of ROM 1 produces a logic level "0" signal which is supplied to one input of AND gate 11 and one input of NAND gate 13. At the same time, the data pickup pulse from terminal 8 is supplied to the other inputs of AND gate 11 and NAND gate 13 whereby a logic level "0" signal is supplied to the J input terminal of flip-flop circuit 10 and a logic level "1" signal is supplied to the $\overline{K}$ input terminal of flip-flop circuit 10. In response thereto, J-K flip-flop circuit 10 produces a logic level "0" signal at its Q output terminal which is supplied to AND gate 12, along with the logic level "0" output from AND gate 11. It should therefore be appreciated that AND gate 12 supplies a logic level "0" signal through inverter 16 and NAND gate 14 to the enable input EN of buffer circuit 4 to enable this latter circuit to directly transmit the respective 10-bit code word from group A, which is produced at output terminals D1-D10 of ROMs 1 and 2, to latch circuit 6. For example, 10-bit code words A1 and A2, each having an equal number of "1" and "0" bits, are transmitted through buffer circuit 4 to latch circuit 6 when corresponding 8-bit code words X1 and X2, respectively, are supplied to input terminal 3 of ROMs 1 and 2. At the same time, a logic level "1" signal is supplied to the enable input EN of inverter circuit 5 to inhibit operation of this circuit. It should be appreciated that the transmitted 10-bit words A1 and A2 are synchronized with the master clock signal from terminal 7 and such synchronized signals are produced at output terminal 17 of latch circuit 6.

When the 8-bit digital information word Y3 is next supplied to input terminal 3 of ROMs 1 and 2, the corresponding 10-bit code word sorted in ROMs 1 and 2 has a ISUM value of 6, that is, such word has six "1" bits and four "0" bits. Accordingly, a logic level "1" signal is produced at flag terminal $D_F$ of ROM 1 and is supplied to AND gate 11 and NAND gate 13, along with the data pickup pulse from terminal 8. However, J-K flip-flop circuit 10 produces a signal at its Q input terminal which remains at logic level "0". Accordingly, a logic level "0" signal is supplied to the enabling input EN of buffer circuit 4 to enable such circuit to transmit the 10-bit code word having an ISUM value of 6 to latch circuit 6. At the same time, a logic level "1" signal is supplied to the enabling input EN of inverter circuit 5 to inhibit the operation of such circuit. In like manner, as shown in the following table, when 8-bit information words X4,X5 and X6 are supplied to input terminal 3 of ROM 1, AND gate 12 produces a logic level "0" output as a result of the output of AND gate 11 being supplied thereto, even though the output of flip-flop circuit 10 at the Q output terminal thereof is at logic level "1". Therefore, buffer circuit 4 is enabled to transmit the corresponding 10-bit code words A4,A5 and A6, each having an ISUM value of 5, to latch circuit 6. It should be appreciated, that although such latter 10-bit code words are indicated in the table as being supplied from map 2, corresponding 10-bit code words in maps 1 and 2 having an ISUM value of 5 are identical so that such 10-bit code words A4,A5 and A6 are effectively supplied from map 2.

| 8-bit digital video signal | X1 | X2 | Y3 | X4 | X5 | X6 | Y7 | Y8 | Y9 | X10 | X11 |
|---|---|---|---|---|---|---|---|---|---|---|---|
| Output at flag terminal $D_F$ | 0 | 0 | 1 | 0 | 0 | 0 | 1 | 1 | 1 | 0 | 0 |
| Q-output of JK flip-flop 10 | 0 | 0 | 0 | 1 | 1 | 1 | 1 | 0 | 1 | 0 | 0 |

In conformance with the above table, when the next 8-bit information word Y7 is supplied to input terminal 3 of ROMs 1 and 2, it is desirable to supply a corresponding 10-bit information signal having an ISUM value of 4 to latch circuit 6. In other words, 10-bit code words supplied to latch circuit 6 and not having an ISUM value of 5 are alternately supplied from map 1 (having an ISUM value of 6) and map 2 (having an ISUM value of 4). Thus, 8-bit digital information word Y7 is converted to 10-bit code word C7 from map 2, having an ISUM value of 4. It is to be rembered, however, that ROMs 1 and 2 only supply 10-bit code words having ISUM values of 5 and 6. However, since the 10-bit code words from group C, having an ISUM value of 4, are identical to the inverted corresponding 10-bit code words from group B, having an ISUM value of 6, the above alternation method is readily accomplished.

Accordingly, the circuit of FIG. 11 inverts the 10-bit digital information word B7, having an ISUM value of 6 and which is stored in ROMs 1 and 2, and supplies such inverted word C7 (or $\overline{B7}$) to latch circuit 6, as follows. When 8-bit digital information word Y7 is supplied to input terminal 3 of ROMs 1 and 2, flag terminal $D_F$ of ROM 1 produces a logic level "1" signal. J-K flip-flop circuit 10, at such time, produces a logic level "1" signal, resulting in a logic level "1" signal also being supplied to the enabling input EN of buffer circuit 4 to inhibit the operation thereof. At the same time, a logic level "0" signal is supplied to the enabling input EN of inverter circuit 5 to enable such circuit to invert the 10-bit code word B7, having an ISUM value of 6, from ROMs 1 and 2 and to supply such inverted 10-bit word C7, having an ISUM value of 4, to latch circuit 6.

In a similar manner, when the 8-bit digital information word Y8 is supplied to input terminal 3, a 10-bit code word B8 from map 1 (having an ISUM value of 6) is transmitted directly through buffer circuit 4 to latch circuit 6. When word Y9 is supplied to input terminal 3, a 10-bit code word B9 (having an ISUM value of 6), which is stored in ROMs 1 and 2, is inverted by inverter circuit 5 and transmitted as a 10-bit code word C9 (from map 2) to latch circuit 6. Lastly, when signals X10 and X11 are supplied to input terminal 3, 10-bit code words A10 and A11 are transmitted sequentially through buffer circuit 4 to latch circuit 6. It should therefore be appreciated that 10-bit code words from ROMs 1 and 2 having an ISUM value of 5 are transmitted directly through buffer circuit 4 to latch circuit 6. However, 10-bit code words having an ISUM value of 6 from ROMs 1 and 2 are alternately supplied through buffer circuit 4 and inverter circuit 5 to latch circuit 6 whereby to produce alternate 10-bit code words having ISUM values of 6 and 4, respectively.

Thus, the entire digital information signal includes an equal number of "1" and "0" bits, as with the prior art system. However, all of the 10-bit code words having an ISUM value of 5 are not utilized in the conversion process according to this invention. Rather, the selected 10-bit code words are chosen according to the weight of the 10-bit code words in relation to the generation frequency of the 8-bit digital information words. The present invention therefore provides maximum reduction of the DC components in the digital information signal while also concentrating the frequency spectrum of the code map for recording purposes so as to eliminate the aforementioned "peak shift" phenomenon. This latter aspect can more readily be seen from FIGS. 8 and 9. In particular, the frequency spectrum of FIG. 9, which is obtained with the method and apparatus according to this invention, achieves a concentrated frequency spectrum in comparison to that of the prior art spectrum of FIG. 8 so as to avoid the "peak shift" phenomenon.

It should be appreciated that, although the above method and apparatus according to this invention have been applied to an 8-to-10 conversion system, the method and apparatus according to this invention may be utilized for converting any N-bit word code to any M-bit word code, where M is greater than N. Further, although a specific embodiment of gating circuit 9 has been shown in FIG. 11, any other suitable arrangement may be utilized in place thereof to selectively enable buffer circuit 4 and inverter circuit 5 in accordance with the output from flag terminal $D_F$ of ROM 1.

Having described a specific preferred embodiment of the invention with reference to the accompanying drawings, it is to be understood that the invention is not limited to this precise embodiment, and that various changes and modifications may be effected therein by one skilled in the art without departing from the scope or spirit of the invention as defined in the appended claims.

What is claimed is:

1. In a method of recording a digital information signal comprised of a plurality of N-bit data words by means of a recording apparatus which imperfectly transmits DC components of said digital information signal, the steps of:

selectively generating M-bit data words in which M is an even integer greater than N and each of said N-bit data words and M-bit data words is comprised of a plurality of logic level "1" bits and logic level "0" bits;

weighting each of said M-bit data words on the basis of a first value corresponding to a number, in the M-bit data word, of boundaries between adjacent "1" and "0" bits, a second value corresponding to the number of said "1" bits in the M-bit data word, and a third value corresponding to the numbers, in the M-bit data word, of isolated "1" and "0" bits bounded on both sides by "0" and "1" bits, respectively, and of isolated pairs of "1" and "0" bits bounded on both sides by "0" and "1" bits, respectively;

grouping the weighted M-bit data words in accordance with the run length of data thereof;

assigning each of said N-bit data words to at least a respective one of said M-bit data words in accordance with the generation frequencies of said N-bit data words so that the run lengths of the assigned M-bit data words will vary generally inversely in respect to the generation frequencies of the respective N-bit data words;

converting said N-bit data words to said respective assigned M-bit data words; and recording on a record medium said M-bit data words to which said N-bit data words are converted so as to minimize DC components of the recorded digital information signal and to concentrate the frequency spectrum.

2. The method according to claim 1 in which the step of grouping said M-bit data words by weight includes the step of forming two coding maps of said M-bit data words, each coding map including $2^N$ M-bit data words, and each of said N-bit data words being selectively assigned to a respective one of said M-bit data words from each of said two coding maps.

3. The method according to claim 1; in which said number of isolated "1" and "0" bits is weighted by a factor of one and the number of isolated pairs of "1" and "0" bits is weighted by a factor of two, wherein said third value for each M-bit data word is obtained by adding the number of isolated "1" and "0" bits to twice the number of isolated pairs of "1" and "0" bits.

4. The method according to claim 1; in which said M-bit data words each have an even number of bits and in which the step of grouping said M-bit data words by weight further includes the step of arranging said M-bit data words in a priority order with M-bit data words of the highest priority having the highest third value, the highest first value and a second value of M/2.

5. The method according to claim 4; in which the step of arranging said M-bit data words in a priority order includes the steps of obtaining M-bit data words having said highest priority; changing the second value by one so that the number of "1" and "0" bits in the arranged M-bit data words differs by two; decreasing the first value by one and repeating the step of changing the second value; repeating the step of decreasing the first value until no more M-bit data words satisfy the remaining combinations of first and second values with said third value; decreasing the third value and obtaining any M-bit data words having said decreased third value, the highest first value and a second value of M/2; and repeating the steps of changing the second value to one through the step of decreasing the third value, until no more M-bit data words satisfy the remaining combinations of first, second and third values.

6. The method according to claim 5; in which N equals 8 and M equals 10 and the priority order for obtaining 256 M-bit words is determined by respective third, first and second values of 10,9,5; 10,8,5; 10,8,6; 10,7,5; 10,7,6; 10,6,5; 10,6,6; 10,5,5; 10,5,6; 7,7,6; 7,6,5; 7,6,6; 7,5,5; 7,5,6; 7,4,5.

7. The method according to claim 2; in which the step of assigning selectively assigns each of said N-bit data words to a respective one of said M-bit data words from one of said coding maps in accordance with the number of "1" bits in each M-bit data word.

8. The method according to claim 7; in which the step of grouping said M-bit data words by weight includes the step of grouping said M-bit data words into a first group consisting of M-bit data words having an equal number of "1" and "0" bits, a second group consisting of M-bit data words having the number of "1" bits greater than the number of "0" bits, and a third group consisting of M-bit data words having the number of "0" bits greater than the number of "1" bits.

9. The method according to claim 8; in which one of said coding maps includes M-bit data words from said first and second groups and the other of said coding maps includes M-bit data words from said first and third groups.

10. The method according to claim 8; in which the step of assigning alternately supplies M-bit data words from said two coding maps for M-bit data words having unequal numbers of "1" and "0" bits.

11. The method according to claim 8; in which the M-bit data words in the third group are obtained by inverting each "1" and "0" bit of the M-bit data words in the second group.

12. The method according to claim 9; in which each coding map includes an equal number of M-bit data words, the M-bit data words from said first group being identical in both of said maps, and the M-bit data words in the third group being identical to inverted M-bit data words in the second group.

13. The method according to claim 12; in which M is equal to 10 and N is equal to 8, and each map includes 256 M-bit data words.

14. In a method of recording a digital information signal comprised of a plurality of N-bit data words by means of a recording apparatus which imperfectly transmits DC components of said digital information signal, the steps of:

selectively generating M-bit data words in which M is an even integer larger than N and each of said N-bit and M-bit data words is comprised of a plurality of logic level "1" bits and logic level "0" bits;

weighting each of said M-bit data words on the basis of a first value corresponding to a number of boundaries between adjacent "1" and "0" bits in the M-bit data word, a second value corresponding to the number of said "1" bits in the M-bit data word, and a third value corresponding to the numbers, in the M-bit data word, of isolated "1" and "0" bits and of isolated pairs of "1" and "0" bits bounded on both sides by "0" and "1" bits, respectively;

grouping the weighted M-bit data words in accordance with the run length of data thereof;

classifying the grouped M-bit data words into a first group consisting of said M-bit data words which have an equal number of said "1" and "0" bits, a second group consisting of said M-bit data words which have a number of said "1" bits greater than the number of said "0" bits, and a third group consisting of said M-bit data words which have a number of said "0" bits greater than the number of said "1" bits;

assigning each of said N-bit data words to at least a respective one of said M-bit data words in accordance with the generation frequencies of said N-bit data words so that the run lengths of the assigned M-bit data words will vary generally inversely in respect to the generation frequencies of the respective N-bit data words, with some of said N-bit data words being assigned alternately to said M-bit data words of said second and third groups and the remainder of said N-bit data words being assigned to said M-bit data words of said first group;

converting said N-bit data words to said respective assigned M-bit data words so as to minimize DC components of the digital information signal, as converted, and to concentrate its frequency spectrum; and recording on a record medium said M-bit data words to which said N-bit data words have been converted.

15. The method according to claim 14; in which said M-bit data words of one of said second and third groups are each inverted with respect to corresponding M-bit data words of the other of said second and third groups.

16. The method according to claim 14; in which the assignment of one of said M-bit data words from one of said second and third groups results in the next M-bit data word from one of said second and third groups being assigned from the other of said second and third groups.

17. The method according to claim 14; further comprising the step of mapping said first and second groups into a first coding map and mapping said first and third groups into a second coding map.

18. Apparatus for reducing DC components in a digital information signal to be recorded and comprised of a plurality of N-bit data words by converting said N-bit data words to respective M-bit data words at least some of which are assigned thereto in accordance with the generation frequency of said N-bit data words and the run length of data of said M-bit data words, comprising:

output means for receiving said M-bit data words;

memory means for storing said M-bit data words either in the actual or inverted form thereof and which are read therefrom in response to said N-bit data words;

each of said M-bit data words being comprised of a plurality of logic level "1" bits and logic level "0" bits and being stored in said memory means with the number of said "1" bits being greater than or equal to the number of said "0" bits;

transmitting means connected with said memory means for transmitting said stored M-bit data words read from said memory means to said output means;

inverting means connected with said memory means for inverting said stored M-bit data words read from said memory means and supplying said inverted M-bit data words to said output means; and gate means selectively enabling one of said transmitting means and inverting means to supply said transmitted M-bit data words and said inverted M-bit data words, respectively, to said output means, said transmitting means being enabled whenever an M-bit data word read from said memory means has an equal number of said "1" and "0" bits and said transmitting means and inverting means being alternately enabled when M-bit data words successively read from said memory means have unequal numbers of said "1" and "0" bits.

19. The apparatus according to claim 18; in which said transmitting means includes a buffer circuit and said inverting means includes an inverter circuit, each having an input for enabling the operation thereof.

20. The apparatus according to claim 18; in which said memory means has a flag terminal which produces an output signal of a first value when an M-bit data word read therefrom has an equal number of "1" and "0" bits and which is of a second value when an M-bit data word read therefrom has an unequal number of "1" and "0" bits.

21. The apparatus according to claim 20; in which said gate means includes flip-flop means for producing an output signal in response to said output signal from said flag terminal and means for enabling one of said transmitting means and inverting means in response to said output signals from said flip-flop means and said flag terminal.

22. The apparatus according to claim 21; in which said flip-flop means is a J-K flip-flop having a J input terminal and a K input terminal; said apparatus further including a first AND gate and a first NAND gate, each supplied with the output signal from said flag terminal and with a data pickup pulse, said AND gate supplying an output signal to said J input terminal and said NAND gate supplying an output signal to said K input terminal; and said means for enabling including a second AND gate supplied with the output signals from said J-K flip-flop and said first AND gate and producing an output signal in response thereto, an inverter circuit for inverting said output signal from said second AND gate, a second NAND gate for enabling said transmitting means in response to said inverted output signal and said data pickup pulse, and a third NAND gate for enabling said inverting means in response to said output signal from said second AND gate and said data pickup pulse.

* * * * *